(12) United States Patent
Hou

(10) Patent No.: US 12,389,711 B2
(45) Date of Patent: Aug. 12, 2025

(54) SOLAR CELL METAL ELECTRODE AND PREPARATION METHOD THEREFOR, AND MASK

(71) Applicant: LONGI GREEN ENERGY TECHNOLOGY CO., LTD., Shaanxi (CN)

(72) Inventor: Lianggong Hou, Nanjing (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 506 days.

(21) Appl. No.: 17/918,001

(22) PCT Filed: Apr. 23, 2021

(86) PCT No.: PCT/CN2021/089331
§ 371 (c)(1),
(2) Date: Oct. 10, 2022

(87) PCT Pub. No.: WO2021/218817
PCT Pub. Date: Nov. 4, 2021

(65) Prior Publication Data
US 2023/0142082 A1    May 11, 2023

(30) Foreign Application Priority Data
Apr. 26, 2020    (CN) .......................... 202010337111.7

(51) Int. Cl.
*H10F 77/20*    (2025.01)
*C23C 14/04*    (2006.01)
(Continued)

(52) U.S. Cl.
CPC .......... *H10F 77/211* (2025.01); *C23C 14/042* (2013.01); *C23C 14/14* (2013.01); *H10F 71/00* (2025.01)

(58) Field of Classification Search
CPC ...... H10F 77/211; H10F 71/00; H10F 77/215; H10F 19/30; C23C 14/042; C23C 14/14;
(Continued)

(56) References Cited

U.S. PATENT DOCUMENTS

| | | | |
|---|---|---|---|
| 2005/0079418 | A1 | 4/2005 | Kelley et al. |
| 2007/0036887 | A1 | 2/2007 | Haase et al. |

(Continued)

FOREIGN PATENT DOCUMENTS

| | | | |
|---|---|---|---|
| CN | 102569506 A | | 7/2012 |
| CN | 102738300 A | | 10/2012 |

(Continued)

OTHER PUBLICATIONS

CN 202010337111.7 first office action and search report.
(Continued)

*Primary Examiner* — Earl N Taylor
(74) *Attorney, Agent, or Firm* — IPro, PLLC

(57) ABSTRACT

Provided are a solar cell metal electrode and a preparation method therefor, and a mask. The preparation method for a solar cell metal electrode in the present invention comprises: laser-etching a polymer film according to a desired electrode shape to prepare a mask; and fixing the mask onto a substrate, and plating the mask with a metal film by using a physical vapor deposition method, so that a metal electrode or an electrode seed layer in the desired shape grows on the substrate. According to the method of the present invention, the preparation cost is low, the conductivity of an electrode prepared is high, the light shielding area is small, and the photoelectric conversion rate is high.

11 Claims, 4 Drawing Sheets

(51) Int. Cl.
*C23C 14/14* (2006.01)
*H10F 71/00* (2025.01)

(58) Field of Classification Search
CPC ........ Y02E 10/50; Y02P 70/50; H01L 21/027; H01L 21/0275; H01L 21/0337; H01L 21/0338; H01L 21/0271; H01L 31/18; H01L 31/022425; H01L 31/0445; H01L 31/022433; H01L 31/0224

See application file for complete search history.

(56) References Cited

U.S. PATENT DOCUMENTS

| | | | |
|---|---|---|---|
| 2016/0218326 A1* | 7/2016 | Fleissner | C23C 14/042 |
| 2017/0194517 A1 | 7/2017 | Erben et al. | |
| 2017/0301801 A1 | 10/2017 | Nguyen | |

FOREIGN PATENT DOCUMENTS

| | | | |
|---|---|---|---|
| CN | 103107212 A | 5/2013 |
| CN | 103137791 A | 6/2013 |
| CN | 104269464 A | 1/2015 |
| CN | 104505435 A | 4/2015 |
| CN | 105390569 A | 3/2016 |
| IT | RM20130516 A1 | 3/2015 |
| JP | H0319378 A | 1/1991 |
| JP | H05326989 A | 12/1993 |
| JP | H1129852 A | 2/1999 |
| JP | 2000031514 A | 1/2000 |
| JP | 2002064214 A | 2/2002 |
| JP | 2002235166 A | 8/2002 |
| JP | 2004273420 A | 9/2004 |
| JP | 2012111985 A | 6/2012 |
| JP | 2013108143 A | 6/2013 |
| JP | 2014107403 A | 6/2014 |
| JP | 2014229633 A | 12/2014 |
| JP | 2015073058 A | 4/2015 |
| JP | 2020053487 A | 4/2020 |
| WO | 2006109753 A1 | 10/2006 |
| WO | 2008047144 A1 | 4/2008 |
| WO | 2015152020 A1 | 10/2015 |
| WO | 2016043234 A1 | 3/2016 |
| WO | 2017119153 A1 | 7/2017 |
| WO | 2018062300 A1 | 4/2018 |
| WO | 2019078598 A1 | 4/2019 |
| WO | 2019130859 A1 | 7/2019 |

OTHER PUBLICATIONS

PCT/CN2021/089331 international search report.
AU 2021262267 Examination report No. 1.
JP2022-562499 first office action.
JP2022562499 fourth office action dated Oct. 10, 2024.
Matteocci, F., et al. "Solid state dye solar cell modules." Journal of Power Sources 246 (2014): 361-364.
Kirihara, Kazuhiro, et al. "Reduction of specific contact resistance between the conducting polymer PEDOT: PSS and a metal electrode by addition of a second solvent during film formation and a post-surface treatment." Synthetic Metals 246 (2018): 289-296.
EP 21797038.3 extended European search report dated May 10, 2024.
JP2022-562499 second office action.
JP2022-562499 third office action.

* cited by examiner

SOLAR CELL METAL ELECTRODE AND PREPARATION METHOD THEREFOR, AND MASK

TECHNICAL FIELD

The disclosure relates to a solar cell metal electrode and a preparation method therefor, and a mask used in the preparation method.

BACKGROUND

A solar cell can convert solar energy into electric energy, wherein the solar energy is an important clean energy. An electrode is a key component of the solar cell, which mainly can be of an array grid structure with a line width of less than 100 μm.

At present, a silver paste screen printing process is widely used in manufacturing of the electrode of the solar cell, and a line width of the obtained electrode can be more than 30 μm. As a main component of the silver paste is silver, the silver paste is high in cost. Meanwhile, conductivity of the silver paste is much lower than that of the silver metal, and in order to achieve a certain conductivity, a relatively thick electrode grid line is needed, which requires more raw materials and further increases its cost. Moreover, with a thick electrode, more sunlight may be blocked. In addition, in printing electrodes of a thin film solar cell, a printing area is 0.72 square meters or more, which results in low yield and high requirements for equipment and processes.

SUMMARY

An object of the present disclosure is to provide a novel preparing method for an electrode.

Another object of the present disclosure is to provide a prepared metal electrode.

Another object of the present disclosure is to provide a solar cell including the metal electrode.

In an aspect, a preparing method for a metal electrode of a solar cell is provided in the disclosure, which including following steps.

A mask is prepared by laser etching a polymer film according to a desired shape of an electrode.

The mask is fixed to a substrate, and a metal film is coated on the mask by a physical vapor deposition method so as to grow a metal electrode or an electrode seed layer with the desired shape on the substrate.

According to a specific embodiment of the present disclosure, in the preparing method for the metal electrode of the solar cell of the present disclosure, the polymer film can be made of polyethylene terephthalate (PET), polyolefin film (PO), polyimide (PI), polyvinyl chloride (PVC), or can be other polymer film with a thickness meeting requirements. The polymer film can be a film without adhesive property or a polymer film with adhesive property, that is, a commonly called adhesive tape.

According to a specific embodiment of the present disclosure, in the preparing method for the metal electrode of the solar cell of the present disclosure, a thickness of the polymer film is 1 μm to 500 μm.

According to a specific embodiment of the present disclosure, in the preparing method for the metal electrode of the solar cell of the present disclosure, preparing the mask includes preparing a slit with the desired shape of the electrode on the polymer film by using ultrafast laser (laser with a pulse width of an order of picosecond or even femtosecond). With the method according to the disclosure, a finely processed polymer film mask can be prepared.

According to a specific embodiment of the present disclosure, in the preparing method for the metal electrode of the solar cell of the present disclosure, a width of the slit of the polymer film etched by laser (i.e., a width of a prepared electrode line) is 1 μm to 1000 μm. Specifically, under the condition of preparing an auxiliary grid line or a common grid line of a crystalline silicon solar cell, the width of the slit is preferably 1 μm to 100 μm, and further preferably 1 μm to 20 μm. Under the condition of preparing a main grid of the crystalline silicon solar cell, the width of the slit is preferably 100 μm to 500 μm. The width of the slit can also be specifically determined according to the desired electrode shape. A length of the slit depends on design of a cell electrode.

According to a specific embodiment of the present disclosure, in the preparing method for the metal electrode of the solar cell of the present disclosure, the substrate may be a solar cell. The mask is fixed to the solar cell and the metal film is coated on the mask by the PVD method, so as to directly grow the metal electrode with the desired shape on the solar cell. The substrate can also be other sheet (here, other sheet refer to a sheet different from the mask). After the metal electrode is coated on the substrate, it is transferred to the solar cell as the electrode of the solar cell. For example, the electrode can be grown on a plastic film (which can be any type with a complete plane, such as a transparent PET film), and then the film with the electrode can be turned over directly and buckled on the solar cell, so as to achieve a same purpose of manufacturing the electrode of the solar cell.

According to a specific embodiment of the present disclosure, in the preparing method for the metal electrode of the solar cell of the present disclosure, fixing the polymer film mask to the substrate can be made by one or combination of more of double-sided adhesive, glue, a fixed clamping slot and a wafer stage. If the mask is provided with the adhesive tape with adhesive property, the fixing can be made by direct adhering.

In the present disclosure, the solar cell is a device with one or more PN junctions being prepared and with photovoltaic effect.

According to a specific embodiment of the present disclosure, in the preparing method for the metal electrode of the solar cell of the present disclosure, when the metal film is coated on the mask by the physical vapor deposition (PVD) method, the PVD method includes a single PVD process or combination of several PVD processes.

According to a specific embodiment of the present disclosure, in the preparing method for the metal electrode of the solar cell of the present disclosure, the adopted metal includes a single metal, an alloy, combination of multiple metals, combination of a metal and an alloy, or combination of alloys.

According to a specific embodiment of the present disclosure, in the preparing method for the metal electrode of the solar cell of the present disclosure, optionally, a non-metallic film may be pre-deposited as a buffer layer before PVD deposition of the metal, or this buffer layer may not be added.

According to a specific embodiment of the present disclosure, in the preparing method for the metal electrode of the solar cell of the present disclosure, the mask can be removed after the metal electrode with the desired shape (i.e., a thin line substantially consistent with a shape of the slit of the mask) is grown on the solar cell.

According to the preparing method according to the disclosure, an electrode which meets conductivity requirement can be directly prepared for use; or an electrode which does not meet the conductivity requirement can be prepared as an electrode seed layer, and then a complete electrode can be continuously prepared through a non-vacuum process such as electroplating, which is a cheaper process.

In a further aspect, the metal electrode prepared by the method described above is further provided in the disclosure. The electrode prepared according to the disclosure can be directly used or can be used as an electrode seed layer.

In a further aspect, a solar cell is further provided in the disclosure, which includes the metal electrode prepared according to the method described above.

In a further aspect, a preparing method for a solar cell is further provided in the disclosure, which includes a process of preparing a metal electrode according to the preparing method for the metal electrode of the solar cell according to the disclosure.

In a further aspect, a mask is further provided in the disclosure, which is prepared by laser etching a polymer film according to a desired shape of an electrode.

According to the disclosure, with the cheap polymer film to prepare the mask, laser scribing can be used to prepare a mask with thinner (for example, any width of 1 μm to 20 μm) and accurately controllable slits for preparation of the electrode.

According to some specific embodiments of the present disclosure, a mask is provided in the present disclosure, which is a polymer film having a slit with an electrode shape. That is, the mask in the present disclosure is a polymer film having a slit hollowed with the electrode shape.

In some embodiments of the present disclosure, in the mask according to the present disclosure, the polymer film may have one or more of following characteristics.

(1) The polymer film can be made of one or more of polyethylene terephthalate (PET), polyolefin film (PO), polyimide (PI) and polyvinyl chloride (PVC).
(2) The polymer film is with adhesive property.

In some embodiments of the present disclosure, the polymer film prepared as the mask has adhesive property, and the adhesive property can be property of the polymer film itself, or can be realized with an adhesive layer attached to a surface of the polymer film. A surface of polymer film with the adhesive property can be used to adhere and fix the polymer film mask to the substrate.

In some embodiments of the present disclosure, in the mask according to the present disclosure, a width of the slit is 1 μm to 1000 μm.

In some embodiments of the present disclosure, in the mask according to the present disclosure, the width of the slit is 1 μm to 100 μm, preferably 1 μm to 20 μm. The mask can be configured for preparing auxiliary grid lines or common grid lines of a crystalline silicon solar cell.

In some embodiments of the present disclosure, in the mask according to the present disclosure, the width of the slit is 100 μm to 500 μm, and the mask can be configured for preparing a main grid of a crystalline silicon solar cell.

In some embodiments of the present disclosure, a thickness of the mask according to the present disclosure is a thickness of the polymer film, which can be 1 μm to 500 μm.

To sum up, a preparing method for a metal electrode of a solar cell is provided in the present disclosure, which has following characteristics.

1. Its preparation cost is low. The mask, the laser preparation process and the PVD process used in the disclosure are all low in cost.

2. The prepared electrode has high conductivity, the conductivity of the used metal is higher than that of the silver paste.
3. A shading area is small. The slit prepared by laser can be as thin as 1 μm to 20 μm or even 1 μm to 10 μm, which is thinner than that of an existing printing process (30 μm to 80 μm), with small shading and high efficiency, and is accurate and controllable.

DETAILED DESCRIPTION

In order to understand technical features, objectives and beneficial effects of the present disclosure more clear, detailed description of technical schemes of the present disclosure is made in the following, which should not be understood as limitation on applicable scope of the present disclosure.

Figure 1:
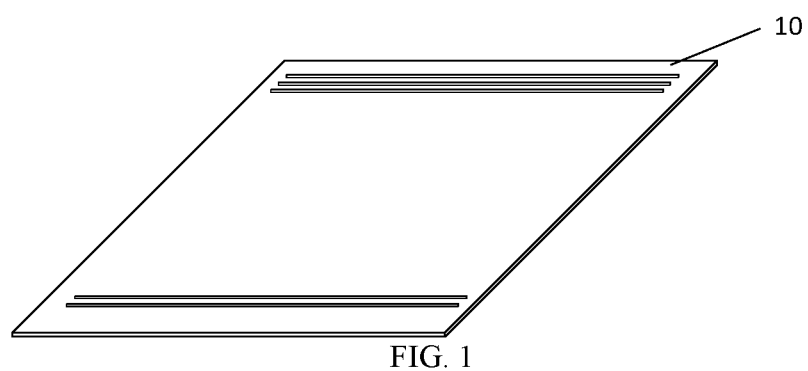
FIG. 1 is a schematic diagram of a mask of a polymer film according to Embodiment 1.
Figure 2:
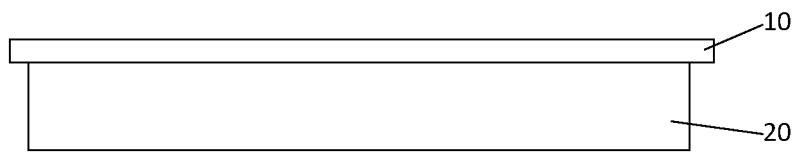
FIG. 2 is a schematic diagram of fixing a mask to a solar cell according to Embodiment 1.

Embodiment 1: Preparation of an Auxiliary Grid of an Electrode of a Heterojunction with Intrinsic Thin-Layer (HIT) Solar Cell A preparing method for an auxiliary grid electrode of the HIT solar cell is provided in this embodiment, which includes following steps:

(1) A polymer film mask is prepared with a laser, in which slits with an interval of 2 mm and a width of 20 μm is cut on a PET or PI plastic film with a thickness of 30 μm by using the laser, so to obtain a PET or PI film mask 10, as shown in FIG. 1. A shape of the slit is determined as desired.
(2) The mask 10 is fixed onto the HIT solar cell 20 with a transparent conductive film prepared by using a double-sided adhesive, and the double-sided adhesive must avoid the slits described in step (1), as shown in FIG. 2.
(3) Coating is performed by using a physical vapor deposition (PVD) method to prepare a metal electrode, in which nickel with a thickness of 20 nm is coated by magnetron sputtering firstly, and then aluminum with a thickness of 8 μm is coated by evaporation.

(4) Electrode grid lines with a spacing of 2 mm, a line width of 20 μm and a height of 8 μm can be obtained by peeling off the PET or PI film.

(5) Steps (1) to (4) are repeated for the other side of the cell to obtain electrode grid lines on the other side.

Cost of the electrode in this embodiment is obviously lower than that of a silver paste screen printing process, and at the same time, the grid lines of 20 μm are narrower than those in the related art, which can reduce sunlight shielding and improve conversion efficiency of solar cells.

Taking a 166 mm silicon wafer as an example, comparison of an electrode in the related art with the electrode prepared according to the present disclosure is as follows.

(1) Cost Comparison

In the related art: dosage of the silver paste for auxiliary grids is 92 mg to 125 mg, price of the silver paste is 4800 CNY/kg to 5500 CNY/kg, resulting in cost of about 0.5 CNY/piece.

In the disclosure: cost of the PET film with a thickness of 30 μm is 0.1 CNY/piece (cost of the PI film with a thickness of 30 μm is 0.12 CNY/piece, it should be noted that PI has high temperature resistance, small deformation, and can be reused for 5 times); Al dosage (including loss) is 2.8 g, with a price of 1.7 CNY/kg, resulting in cost of 0.05 CNY/piece; and cost of glue and laser is 0.03 CNY/piece, thus resulting in total cost of 0.18 CNY/piece (or 0.20 CNY/piece for the PI film).

(2) Comparison of Shading Area

In the related art: the auxiliary grid is 40 μm in width with a spacing of 1.7 mm, and resulting in a shading rate of 2.35%.

In the disclosure: the auxiliary grid is 20 μm in width with a spacing of 2.0 mm, and resulting in a shading rate of 1.0%.

It can be seen from the above comparison that compared with the related art, the shading can be reduced by 57% and the cost can be reduced by 60% in the disclosure.

Figure 3:
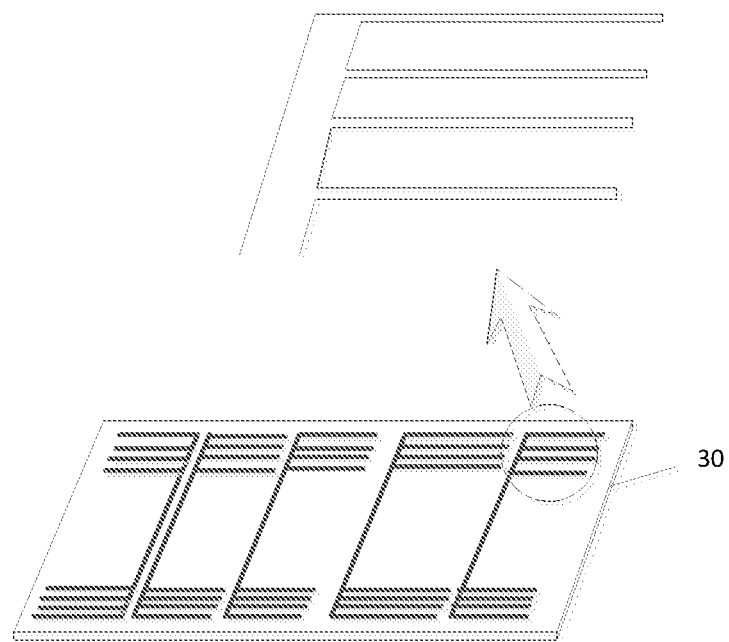
FIG. 3 is a schematic diagram of a mask of a polymer film according to Embodiment 2.

Embodiment 2: Preparation of (an Auxiliary Grid and a Main Grid of) an Electrode of a Heterojunction with Intrinsic Thin-Layer (HIT) Solar Cell A preparing method for an electrode of the HIT solar cell is provided in this embodiment, which including following steps:

(1) A polymer film mask is prepared with a laser, in which slits required by the electrode is cut on an adhesive PO plastic film with a thickness of 35 μm by using the laser, with a pattern seen in FIG. 3, so as to obtain a PO film mask 30, as shown in FIG. 3.

Figure 4:
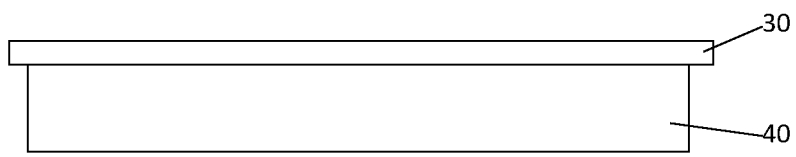
FIG. 4 is a schematic diagram of fixing a mask to a solar cell according to Embodiment 2.

(2) The mask 30 is adhered to the HIT solar cell 40 with a transparent conductive film prepared, as shown in FIG. 4.

(3) Coating is performed by using a physical vapor deposition (PVD) method to prepare an metal electrode, in which nickel with a thickness of 20 nm is coated by magnetron sputtering firstly, and then aluminum with a thickness of 8 μm is coated by evaporation.

(4) auxiliary grid lines with a spacing of 2 mm, a line width of 20 μm and a height of 8 μm and main grids with a spacing of 33 mm, a width of 300 μm and a height of 8 μm can be obtained by peeling off the PO film.

(5) Steps (1) to (4) are repeated for the other side of the cell to obtain electrode grid lines on the other side.

Cost of the electrode in this embodiment is obviously lower than that of a silver paste screen printing process, and at the same time, the auxiliary grid lines of 20 μm and the main grids of 300 μm are both narrower than those in the related art, which can reduce sunlight shielding and improve conversion efficiency of solar cells.

Taking a 166 mm silicon wafer as an example, comparison of an electrode in the related art with the electrode prepared according to the present disclosure is as follows.

(1) Cost Comparison

In the related art: dosage of the silver paste for auxiliary grids is 165 mg to 180 mg, price of the silver paste is 4800 CNY/kg to 5500 CNY/kg, resulting in cost of about 0.85 CNY/piece.

In the disclosure: cost of the PO film with a thickness of 35 μm is 0.18 CNY/piece; Al dosage (including loss) is 2.8 g, with a price of 1.7 CNY/kg, resulting in cost of 0.05 CNY/piece; and cost of laser is 0.01 CNY/piece, thus resulting in total cost of 0.26 CNY/piece.

(2) Comparison of Shading Area

In the related art (5BB): the auxiliary grid is 40 μm in width with a spacing of 1.7 mm, the main grid is 0.7 mm in width with a spacing of 33 mm. The shading rate is 4.5%.

In the disclosure: the auxiliary grid is 20 μm in width with a spacing of 2.0 mm, the main grid is 0.3 mm in width with a spacing of 33 mm. The shading rate is 1.9%.

It can be seen from above comparison that compared with the related art, the shading can be reduced by 58% and the cost can be reduced by 70% in the disclosure.

Embodiment 3: Preparation of an Electrode of a Thin Film Solar Cell

Figure 5:
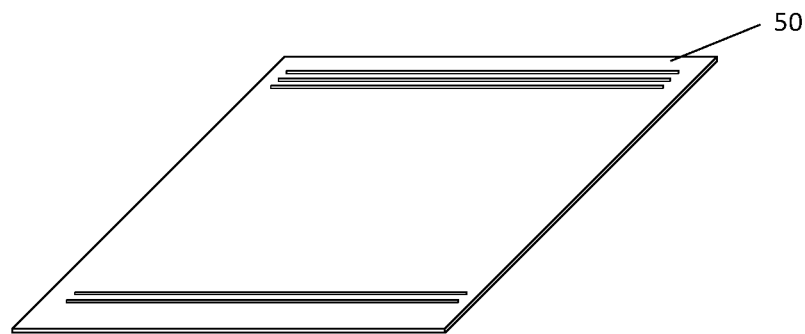
FIG. 5 is a schematic diagram of a mask of a polymer film according to Embodiment 3.

A preparing method for an electrode of a thin film solar cell (a cadmium telluride solar cell, a copper indium gallium selenium solar cell, a perovskite solar cell) is provided in this embodiment, and which including includes following steps:

(1) A polymer film mask is prepared with a laser, in which slits with a spacing of 4 mm and a width of 80 μm is cut on an adhesive PVC plastic film with a thickness of 65 μm by using the laser, with a slit pattern seen in FIG. 5, so as to obtain a PVC film mask 50, as shown in FIG. 5.

Figure 6:
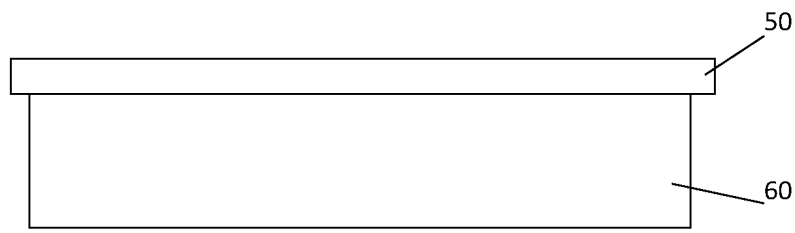
FIG. 6 is a schematic diagram of fixing a mask to a solar cell according to Embodiment 3.

(2) The mask 50 is adhered to the PET film 60 with a thickness of 100 μm, as shown in FIG. 6.

(3) Coating is performed using a physical vapor deposition (PVD) method to prepare a metal electrode, in which nickel with a thickness of 20 nm is coated by magnetron sputtering firstly, then copper with a thickness of 2 μm is coated by evaporation, and then the nickel with a thickness of 20 nm is coated by magnetron sputtering.

(4) The electrode with a spacing of 4 mm, a line width of 80 μm and a height of 2 μm grown on the PET film can be obtained by peeling off the PVC film.

Figure 7:
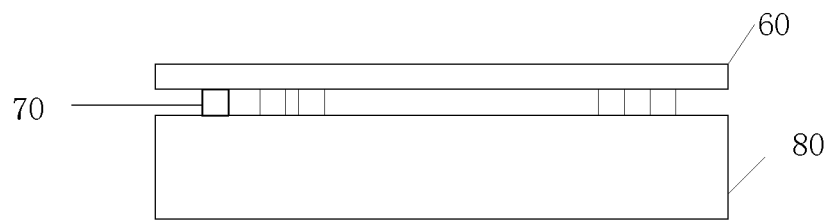
FIG. 7 is a schematic diagram of integrating the electrode prepared according to the disclosure with a solar cell according to Embodiment 3.

(5) The electrode 70 grown on the PET film 60 obtained in step (4) is adhered to the thin film solar cell 80 coated with a transparent conductive film layer, with a side of the electrode 70 facing the solar cell. Namely, preparation of the electrode is complete, as shown in FIG. 7. After subsequent lamination and other processes, the electrode can be attached to a surface of the cell.

The electrode in this embodiment has the following advantages:

a. the electrode is grown on the PET film and then reversed and adhered to the surface of the cell, which can reduce scrap of a whole assembly caused by poor electrode processing, and is especially suitable for preparation of the electrode of the thin film solar cell. Compared with a crystalline silicon solar cell with a length and a width both being 166 mm, the electrode is required to be prepared on a substrate with a width of 600 mm and a length of 1200 mm or a substrate with a larger size for the thin film solar cell. The larger the size, the lower the yield.
b. The cost is lower than that of the silver paste screen printing process.

Embodiment 4

An electrode seed layer is prepared firstly and then the electrode is prepared by a non-vacuum process.

Figure 8:
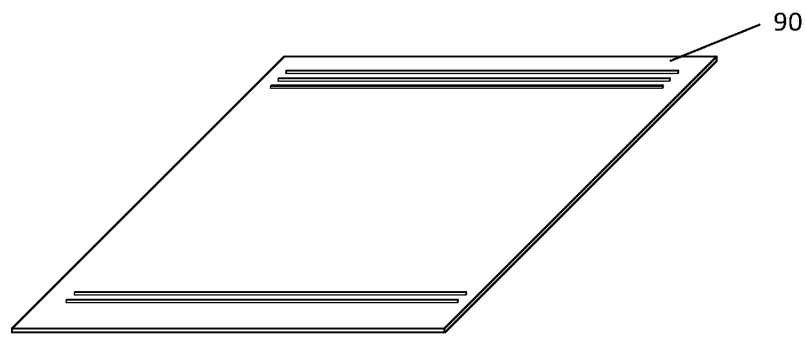
FIG. 8 is a schematic diagram of a mask of a polymer film according to Embodiment 4.
Figure 9:
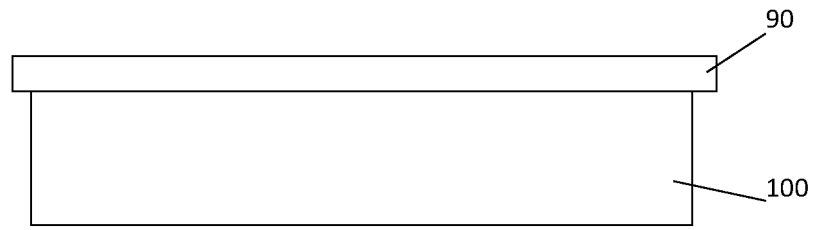
FIG. 9 is a schematic diagram of fixing a mask to a solar cell according to Embodiment 4.
Figure 10:
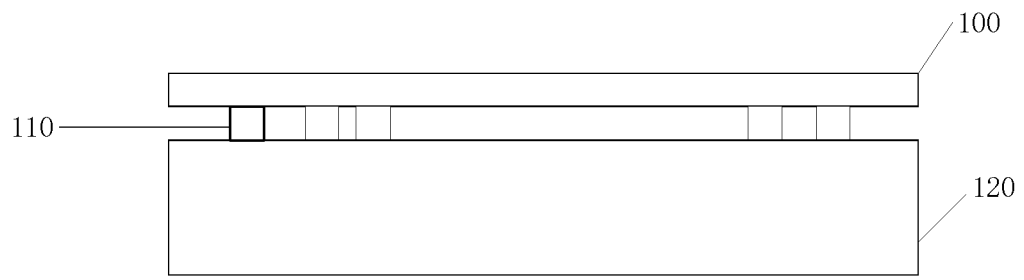
FIG. 10 is a schematic diagram of integrating the electrode prepared according to the disclosure with a solar cell according to Embodiment 4.

In this embodiment, a method is provided in which an electrode seed layer is prepared firstly and then the electrode is prepared by a non-vacuum process, which includes following steps:
(1) A polymer film mask is prepared with a laser, in which slits with a spacing of 2 mm and a width of 30 μm is cut on an adhesive PVC plastic film with a thickness of 65 μm by using the laser, with a slit pattern seen in FIG. 8, so as to obtain a PVC film mask 90, as shown in FIG. 8.
(2) The mask 90 is adhered to the PO film 100 with a thickness of 100 μm, as shown in FIG. 9.
(3) Coating is performed by using a physical vapor deposition (PVD) method to prepare the metal electrode seed layer, in which copper with a thickness of 200 nm is coated by magnetron sputtering.
(4) The electrode seed layer with a spacing of 2 mm, a line width of 30 μm and a height of 200 nm grown on the PO film can be obtained by peeling off the PVC film.
(5) film coating is continued to be made on the electrode seed layer obtained in step (4) using an electroplating process to a height of 3 μm.
(6) The electrode 110 grown on the PO film 100 obtained in step (5) is adhered to the thin film solar cell or HIT cell 120 coated with a transparent conductive film layer, with a side of the electrode 110 facing the solar cell. Namely, preparation of the electrode is complete, as shown in FIG. 10. After subsequent lamination and other processes, the electrode can be attached to a surface of the cell.

The electrode in this embodiment has the following advantages:
a. the non-vacuum electroplating process is a low temperature process, with which electrode growth can be quickly completed.
b. The cost is lower than that of the silver paste screen printing process.

The above is only preferred embodiments of the present disclosure and can also be used for other types of solar cells, but not intended to limit the present disclosure; and any modification, equivalent substitution and improvement made within the spirit and principle of the present disclosure should be encompassed in the protection scope of the present disclosure.

The invention claimed is:

1. A preparing method for a metal electrode of a solar cell, comprising:
preparing a patterned mask by laser etching a polymer film according to a desired shape of an electrode, wherein the patterned mask has adhesive property;
moving the patterned mask onto a substrate and fixing the patterned mask to the substrate, and coating a metal film on the patterned mask by a physical vapor deposition method so as to grow a metal electrode or an electrode seed layer with the desired shape on the substrate; and
peeling off the patterned mask after the metal electrode or the electrode seed layer with the desired shape is grown on the substrate.

2. The preparing method according to claim 1, wherein a thickness of the polymer film is 1 μm to 500 μm.

3. The preparing method according to claim 1, wherein preparing the patterned mask comprises preparing a slit with the desired shape of the electrode on the polymer film by using ultrafast laser.

4. The preparing method according to claim 3, wherein a width of the slit is 1 μm to 1000 μm.

5. The preparing method according to claim 1, wherein the substrate is a solar cell or other sheet.

6. The preparing method according to claim 1, wherein fixing the patterned mask to the substrate is made by one or combination of more of double-sided adhesive, glue, a fixed clamping slot and a wafer stage.

7. The preparing method according to claim 1, wherein an adopted metal comprises a single metal, an alloy, combination of multiple metals, combination of a metal and an alloy, or combination of alloys; and
before the step of coating a metal film on the patterned mask by a physical vapor deposition method, the method further comprises pre-depositing a non-metallic film as a buffer layer.

8. A preparing method for a solar cell, comprising a process of preparing a metal electrode according to the preparing method of claim 1.

9. The preparing method according to claim 4, wherein under the condition of preparing an auxiliary grid line or a common grid line of a crystalline silicon solar cell, the width of the slit is 1 μm to 100 μm.

10. The preparing method according to claim 9, wherein the width of the slit 1 μm to 20 μm.

11. The preparing method according to claim 4, wherein under the condition of preparing a main grid of the crystalline silicon solar cell, the width of the slit is 100 μm to 500 μm.

* * * * *